United States Patent
Brink et al.

(10) Patent No.: US 6,184,524 B1
(45) Date of Patent: *Feb. 6, 2001

(54) AUTOMATED SET UP OF AN ENERGY FILTERING TRANSMISSION ELECTRON MICROSCOPE

(75) Inventors: Henri Adriaan Brink, Berkeley; John Andrew Hunt, Freemont, both of CA (US); Michael Karl Kundmann, Downers Grove, IL (US)

(73) Assignee: Gatan, Inc., Pleasanton, CA (US)

( * ) Notice: Under 35 U.S.C. 154(b), the term of this patent shall be extended for 0 days.

This patent is subject to a terminal disclaimer.

(21) Appl. No.: 09/138,416

(22) Filed: Aug. 24, 1998

Related U.S. Application Data

(63) Continuation-in-part of application No. 08/684,973, filed on Aug. 7, 1996, now Pat. No. 5,798,524.

(51) Int. Cl.$^7$ .................................................... H01J 47/00
(52) U.S. Cl. ......................... 250/305; 250/307; 250/311
(58) Field of Search ................................... 250/305, 307, 250/311

(56) References Cited

U.S. PATENT DOCUMENTS

| 3,629,578 | 12/1971 | Poole . |
| 4,017,403 | 4/1977 | Freeman . |

(List continued on next page.)

FOREIGN PATENT DOCUMENTS

| 0 241 060 | 10/1987 | (EP) . |
| 1 364 930 | 8/1974 | (GB) . |

(List continued on next page.)

OTHER PUBLICATIONS

Patent Abstracts of Japan, vol. 096, No. 011, Nov. 29 1996 & JP 08 195298 A (Nissin High Voltage Co LTD), Jul. 30 1996.

*Primary Examiner*—Bruce C. Anderson
(74) *Attorney, Agent, or Firm*—Killworth, Gottman, Hagan & Schaeff, L.L.P.

(57) ABSTRACT

Electron optical aberrations of an energy filtering system of an energy filtering transmission electron microscope (EFTEM) are automatically corrected under computer control to set up the EFTEM for use. Optics of the electron microscope preceding an energy filter are used to scan the beam at the entrance to the filter in a pattern corresponding to a defined geometry. The beam can either be finely focused to yield a spot at each position visited during the pattern scan, or the beam can be spread out and imprinted with a well-defined intensity distribution, such as normally occurs due to passage of the beam through a specimen, so that its relative scanned displacements can be assessed using cross-correlation techniques. In the case of the finely focused beam, electron images of the scanned pattern directly yield a spot pattern image. Deviations of the recorded spot pattern image from the defined scan geometry reflect the imaging aberrations introduced by the energy filter. In the case of the spread out beam, post-filter electron images of the scanned beam are cross-correlated with an image of the beam taken without scanning yielding cross-correlation peak images that give the effective displacement of each scanned beam position due to the aberrations/distortions of the filter. Summing the cross-correlation peak images again yields a spot pattern image that is equivalent to that obtained in the focused beam case. Deviations of the recorded spot pattern image from the defined scan geometry are analyzed to assess and subsequently correct aberrations introduced by the energy filter.

22 Claims, 10 Drawing Sheets

U.S. PATENT DOCUMENTS

| | | |
|---|---|---|
| 4,373,364 | 2/1983 | Tanimoto et al. . |
| 4,379,250 | 4/1983 | Hosoki et al. . |
| 4,414,474 | 11/1983 | Crewe . |
| 4,443,737 | 4/1984 | van Tol . |
| 4,503,334 | 3/1985 | King et al. . |
| 4,593,196 | 6/1986 | Yates . |
| 4,710,672 | 12/1987 | van Tol . |
| 4,727,844 | 3/1988 | Morita et al. . |
| 4,737,646 | 4/1988 | King et al. . |
| 4,740,704 | 4/1988 | Rose et al. . |
| 4,743,756 | 5/1988 | Krivanek . |
| 4,760,261 | 7/1988 | Rose et al. . |
| 4,789,780 | 12/1988 | Le Poole et al. . |
| 4,812,652 | 3/1989 | Egle et al. . |
| 4,829,444 | 5/1989 | Saitou et al. . |
| 4,851,670 | 7/1989 | Krivanek . |
| 4,876,507 | 10/1989 | Van Vaals . |
| 4,882,486 | 11/1989 | Kruit . |
| 4,943,711 | 7/1990 | Van Aller et al. . |
| 4,950,949 | 8/1990 | van der Wilk . |
| 4,988,929 | 1/1991 | Spajer et al. . |
| 5,004,919 | 4/1991 | Kondo . |
| 5,055,679 | 10/1991 | Ninomiya et al. . |
| 5,081,354 | 1/1992 | Ohhashi et al. . |
| 5,107,520 | 4/1992 | Karam et al. . |
| 5,115,130 | 5/1992 | Suzuki et al. . |
| 5,177,631 | 1/1993 | Krahl et al. . |
| 5,225,999 | 7/1993 | Luzzi . |
| 5,268,579 | 12/1993 | Bleeker et al. . |
| 5,291,095 | 3/1994 | Bohlander . |
| 5,300,775 | 4/1994 | Van der Mast . |
| 5,336,885 | 8/1994 | Rose et al. . |
| 5,343,112 | 8/1994 | Wegmann et al. . |
| 5,393,976 | 2/1995 | Koike . |
| 5,414,261 | 5/1995 | Ellisman et al. . |
| 5,432,347 | 7/1995 | Coene . |
| 5,444,328 | 8/1995 | Van Zutphen . |
| 5,448,063 | 9/1995 | De Jong et al. . |
| 5,449,914 | 9/1995 | Rose et al. . |
| 5,519,216 | 5/1996 | Benner et al. . |
| 5,578,823 | 11/1996 | Taniguchi . |
| 5,895,916 * | 4/1999 | Tsukajima et al. .................. 250/305 |
| 5,923,034 * | 7/1999 | Ogasawara et al. ................. 250/311 |
| 5,981,948 * | 11/1999 | Taniguchi et al. .................... 250/311 |

FOREIGN PATENT DOCUMENTS

| | | |
|---|---|---|
| 2 002 547 | 2/1979 | (GB) . |
| 2 265 729 | 10/1993 | (GB) . |
| 61-277141 | 12/1986 | (JP) . |
| 1-107532 | 4/1989 | (JP) . |
| 6-162977 | 6/1994 | (JP) . |
| 516316 | 11/1976 | (SU) . |
| 920892 | 9/1982 | (SU) . |
| 1048532 | 10/1983 | (SU) . |
| WO 97 08732 | 3/1997 | (WO) . |
| WO 98/06125 | 2/1998 | (WO) . |

* cited by examiner

AUTOMATED SET UP OF AN ENERGY FILTERING TRANSMISSION ELECTRON MICROSCOPE

CROSS-REFERENCE TO RELATED APPLICATIONS

This application is a continuation-in-part of U.S. patent application Ser. No. 08/684,973, filed Aug. 7, 1996, and entitled AUTOMATED ADJUSTMENT OF AN ENERGY FILTERING TRANSMISSION ELECTRON MICROSCOPE which issued on Aug. 25, 1998 as U.S. Pat. No. 5,798,524, the disclosure of which is hereby incorporated by reference.

BACKGROUND OF THE INVENTION

1. Field of the Invention

The invention of the present application relates in general to energy filtering transmission electron microscopes and, more particularly, to an automated adjustment or set up of energy filtering systems of energy filtering transmission electron microscopes.

2. Description of Prior Art

Modern energy filtering transmission electron microscopes (EFTEMs) are able to form images from energy resolved subsets of an electron beam which has traversed a specimen. However, the images produced by energy filtering microscopes will be aberrated and distorted unless optical defects inherent to an energy dispersing element of an energy filtering system are precisely compensated by additional electron lenses within the energy filtering system. Making the needed adjustments is a task requiring a high level of theoretical knowledge and experimental skill which restricts the availability of modern EFTEMs to a handful of experts.

Accordingly, there is a need for an arrangement for automatically performing the adjustments needed to set up EFTEMs for effective usage such that the power of modern EFTEMs would become available to a much wider range of scientific researchers.

SUMMARY OF THE INVENTION

This need is met by the invention of the present application wherein electron optical aberrations of an energy filtering system of an energy filtering transmission electron microscope (EFTEM) are automatically corrected under computer control to set up the EFTEM for use.

Optics of the electron microscope preceding an energy filter are used to scan the beam at the entrance to the filter in a pattern corresponding to a defined geometry. The beam can either be finely focused to yield a spot at each position visited during the pattern scan, or the beam can be spread out and imprinted with a well-defined intensity distribution, such as normally occurs due to passage of the beam through a specimen, so that its relative scanned displacements can be assessed using cross-correlation techniques. In the case of the finely focused beam, electron images of the scanned pattern, as recorded at some point beyond the energy filter, directly yield a spot pattern image. Deviations of the recorded spot pattern image from the defined scan geometry reflect the imaging aberrations introduced by the energy filter. In the case of the spread out beam, post-filter electron images of the scanned beam are cross-correlated with an image of the beam taken without scanning, i.e, an undeflected beam image, yielding cross-correlation peak images that give the effective displacement of each scanned beam position due to the aberrations/distortions of the filter. Summing the cross-correlation peak images again yields a spot pattern image that is equivalent to that obtained in the focused beam case. Deviations of the recorded spot pattern image from the defined scan geometry are analyzed to assess and subsequently correct aberrations introduced by the energy filter.

Optics of the electron microscope preceding an energy filter are used to finely focus or spread the beam at the entrance to the filter with the beam then being scanned in a pattern corresponding to a defined geometry with the scanned beam images being used to determine points of relative scanned displacement. For correction of achromaticity, an offset is applied to the energies of the beam electrons by changing the accelerating voltage at an electron gun of the transmission electron microscope (TEM). The known positions of the scanned beam image are again located and the differences between the current positions and those measured before the change in beam energy are determined. The differences are averaged and the net average displacement is taken as a measure of the energy filtering system's departure from true achromatic imaging. If the net average displacement is not within operator specified tolerances, the effect on average displacement to changes in the current of a chromatic adjustment quadrupole lens of post-slit electron optics of the energy filtering system is assessed. The current in the chromatic adjustment quadrupole lens is changed and the measurement of net average displacement of scanned beam image positions is repeated. These operations are iteratively performed if more precise achromatic adjustment is required or until the measured average displacement is within specified tolerances at which time the image formed at the beam detector is deemed to be achromatic.

For correction of magnification and aspect ratio, the scanned beam image positions are located. The average distance between positions along the top and bottom of the scanned beam image is determined and the average distance between positions along the right and left sides of the scanned beam image is determined with these two distances being used to calculate the overall magnification, M, of the image, and the ratio of the vertical to the horizontal magnification is utilized to obtain the aspect ratio, A, of the image. The incremental effects on M and A of currents flowing through first and second magnification adjusting quadrupole lenses of the post-slit electron optics of the energy filtering system are computed and used to determine current changes which are applied to the magnification adjusting quadrupole lenses. The measurements of M and A are repeated and, if the measured values still deviate from preferred values by more than operator specified tolerances, the entire procedure, starting with the controlled changes to the quadrupole currents, is iterated until the specified tolerances are met.

An image of the scanned beam is captured by an electron camera and the location of the center of each scanned beam illumination within the image is determined. The position data is analyzed relative to nominal positions using least squares fits, one for horizontal measured coordinates and the other for vertical measured coordinates. Aberration coefficients are determined and nullified by adjustments to currents passing through three sextupole lenses of post-slit electron optics of the energy filtering system.

It is, thus, an object of the present invention to provide an autoadjustment set up method and apparatus for an energy filtering transmission electron microscope which can adjust an energy filtering system of the microscope using images of strategically placed scanned beam illumination; to provide an autoadjustment set up method and apparatus for an energy filtering transmission electron microscope which can adjust an energy filtering system of the microscope to consistently achieve and exceed required precision for the adjustments; and, to provide an autoadjustment set up method and apparatus for an energy filtering transmission electron microscope which can adjust an energy filtering system of the microscope with computational demands which can be met by a conventional personal computer interfaced to energy filtering system hardware.

Other objects and advantages of the invention will be apparent from the following description, the accompanying drawings and the appended claims.

DETAILED DESCRIPTION OF THE INVENTION

Figure 1:
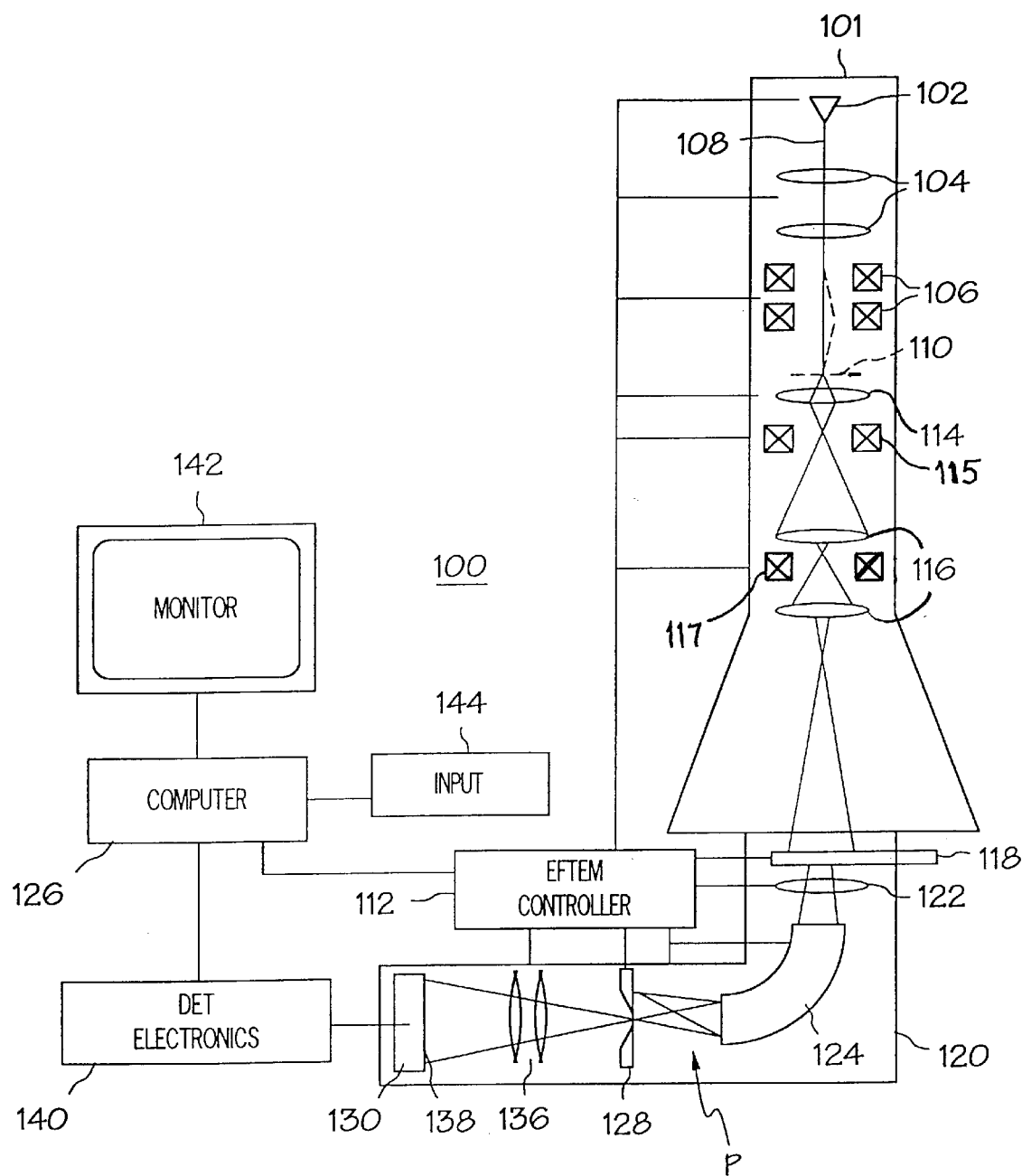
FIG. 1 is a schematic side view of an energy filtering transmission electron microscope (EFTEM) system operable in accordance with the present invention.

The invention will now be described with reference to the drawings wherein FIG. 1 is a schematic side view of an energy filtering transmission electron microscope (EFTEM) system 100 operable in accordance with the present invention. The EFTEM system 100 includes a transmission electron microscope (TEM) 101 which comprises an electron gun 102, condenser lenses 104 and an illumination deflector system 106 which together focus a beam of electrons 108 onto a thin sample 110. The beam of electrons 108 thus focused upon the sample 110 are mono-energetic, i.e., all the electrons in the beam have the same energy which is determined by an accelerating voltage applied to the electron gun 102 under the control of an EFTEM controller 112. For example, the beam energy or the energy supplied to each beam electron as a result of the accelerating voltage has an operator-selected value in the range of about 40,000 to about 2,000,000 electron-volts (eVs) with a typical tolerance of ±1 eV.

Electrons transmitted through the sample 110 form an image which is magnified by an objective lens 114, aligned with an optic axis of the projector lens system by shift coils 115, 117 and further magnified by projector lenses 116. The beam electrons interact with the sample 110 by a variety of mechanisms, thereby transferring varying amounts of energy to the sample 110. The energy transfers, termed energy losses in the field of transmission electron microscopy, alter the distribution of electron energies present in the image at all points beyond the sample 110 or specimen plane. Accordingly, the transmitted image no longer consists of mono-energetic electrons, but rather of electrons with energies that have been reduced in energy by anywhere between zero and several thousand eVs relative to the initial acceleration energy.

A portion of the transmitted electron image is passed through an entrance aperture assembly 118 of an energy filtering system 120, conditioned by pre-slit optics 122, and passed through an electron prism or energy dispersing element 124. The entrance aperture assembly 118 is controlled by a computer 126 to position one of a number of different filter entrance apertures to intercept the beam or to retract the apertures fully to permit the entire beam to enter the filtering system 120. Three or four aperture sizes or shapes are commonly used; however, any reasonable number of apertures can be provided for a given EFTEM.

Figure 2:
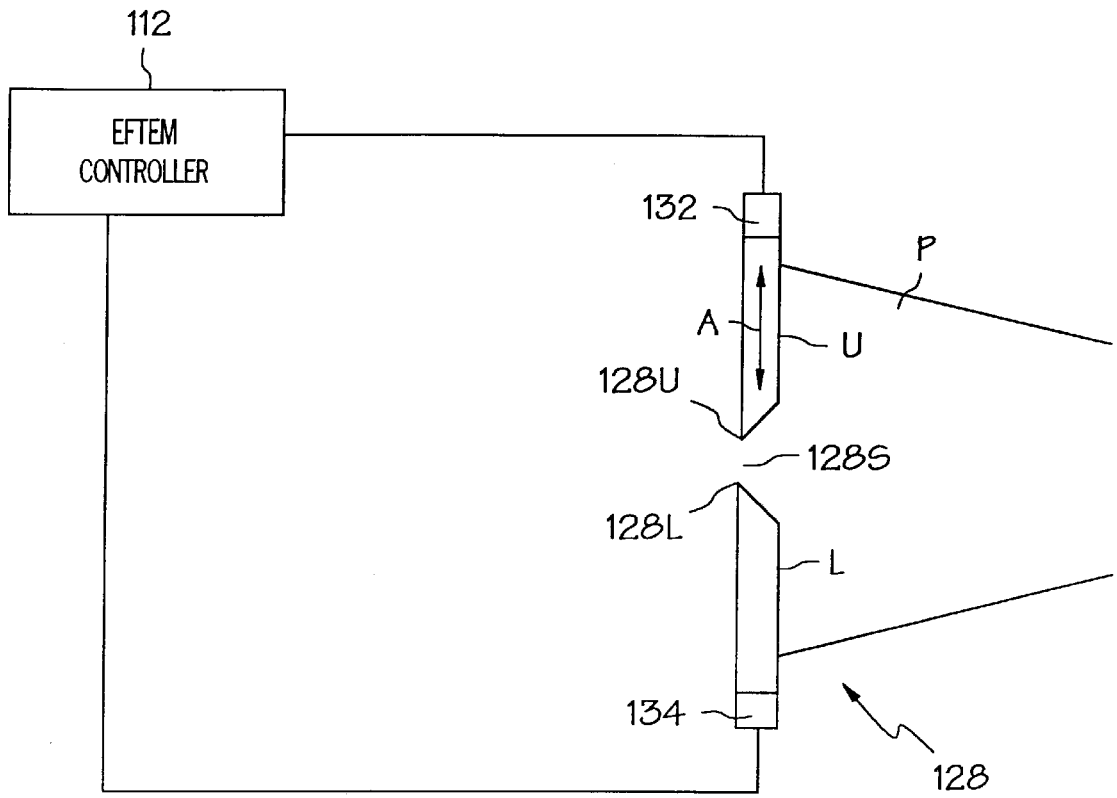
FIG. 2 schematically illustrates an energy-selecting slit assembly of the EFTEM system of FIG. 1.

The pre-slit optics 122 and the dispersing element 124 act upon the beam to produce a beam intensity profile P at the plane of an energy-selecting slit assembly 128, which defines a slit opening 128S and a beam detector made up by current detectors 132, 134 of FIG. 2. One of the two orthogonal spatial dimensions of the beam or rather beam image is reduced to have a very narrow spatial width and, in its place, the beam electron energy losses are dispersed along that dimension, as suggested in FIGS. 1 and 2, to form an energy loss spectrum at the energy-selecting slit assembly 128. In a working embodiment of the invention, the dispersion of the energy loss spectrum has a value in the range of 1 to 10 micrometers ($\mu$m) per eV.

The energy loss spectrum or beam intensity profile P is oriented such that the energy loss dimension is in the plane of FIGS. 1 and 2 and directed across or transverse to upper and lower knife edges 128U, 128L of the energy-selecting slit assembly 128 as shown in FIG. 2. The range of electron energies permitted to contribute to the electron image at all points beyond the plane of the energy-selecting slit assembly 128, especially at a beam detector assembly 130, is thus controlled by the size of the slit opening 128S and the positioning of the zero energy loss portion of the spectrum, which is termed the zero loss peak in the field of energy filtered transmission electron microscopy, with respect to the center of the slit opening 128S. It should be noted that a typical transmission sample 110 has a thickness so small that the zero loss peak is the most prominent feature of the spectrum, comprising at a minimum 5%, but more typically 30% or more, of the total spectrum intensity.

The position of the zero loss peak with respect to the center of the slit opening 128S is controlled by two independent instrument parameters, the accelerating voltage at the electron gun 102 and the control current passing through the dispersing element 124, both of which can be controlled by the EFTEM controller 112 or by the computer 126 through the EFTEM controller 112. The energy-selecting slit assembly 128 is also controlled by the EFTEM controller 112 or by the computer 126 through the EFTEM controller 112 to select the size of a desired slit opening 128S, as indicated by an arrow A in FIG. 2, and also the positioning of the slit assembly 128, i.e., having a slit mechanism inserted into the beam path or entirely retracted from the beam path. The slit assembly 128 can be controlled to vary the size of the slit opening 128S from less than 1 μm (micron), fully closed and approximating 0 μm, to about 300 μm. For a range of slit openings from about 0 μm to about 150 μm, the slit passes electrons having a range of energies from about 0 eV to about 75 eV.

Any portion of the energy-dispersed beam intensity profile P intercepted by an upper portion U of the slit assembly 128 which defines the slit opening 128S is converted to a signal proportional to the intercepted beam current by the current detector 132 and is read by the computer 126. Any portion of the energy-dispersed beam in tensity profile P intercepted by the lower portion L of the slit assembly 128 which defines the slit opening 128S is converted to a signal proportional to the intercepted beam current by the current detector 134 and is also read by the computer 126. The slit mechanism of the slit assembly 128 may also be fully retracted from the beam path, for example by the computer 126 via the EFTEM controller 112, for example when it is desired to have all energy losses contribute to an electron image formed beyond the plane of the slit assembly 128.

After passing through the slit assembly 128, the electron image is further conditioned by post-slit optics 136, and ultimately projected as a final image 138 onto the beam detector assembly 130. The beam detector assembly 130 transforms the electron image 138 into a series of signals which are sent to detector electronics 140, where the signals are processed and transmitted to the computer 126. Preferably, the beam detector assembly 130 may comprise an electron camera and preferably a slow scan CCD camera that converts the electron image 138 into a light image in a thin scintillator, transmits the light image to a scientific-grade slow-scan CCD chip, reads and digitizes the image to have high sensitivity and dynamic range, and transmits the image to the computer 126 over a digital interface. However, other cameras giving immediate electronic readout can also be used, such as TV-rate cameras adapted for the detection of electron images, 1-dimension detectors that detect images by scanning them over the detector in a transverse direction and even single-channel detectors that detect images by scanning them over the detector in two different directions.

The computer 126 is equipped with a monitor 142 for displaying images and other data, and an input device 144 such as a keyboard, mouse, or a trackball for accepting user input. The computer 126 has communication links to the entire microscope/filtering system 101, 120 via the EFTEM controller 112, and is able to control all salient elements of the EFTEM system 100, including the accelerating voltage of the electron gun 102, the entrance aperture assembly 118, the pre-slit optics 122, the energy dispersing element 124, the slit assembly 128, the post-slit optics 136 and the beam detector assembly 130.

While the energy filtering system 120 of the EFTEM system 100 should be apparent to those skilled in the art from the foregoing description, an example of an energy filter and a precision controlled slit mechanism for such a filter are disclosed in commonly owned U.S. Pat. No. 4,851,670 and U.S. Pat. No. 5,640,012 which are both incorporated by reference. A Castaing-Henry filter for use in the TEM 101 is described by Castaing et al. in Comptes Rendus d'Académie des Sciences (Paris), vol. 255, pp. 76–78 (1962); and, the action of sextupole lenses included in the EFTEM system 100 can be understood using the beam matrix approach described by Brown et al. in the report 80-04 published by the European Organization for Nuclear Research in Geneva, Switzerland (1980), which are both incorporated by reference.

The invention of the present application automatically performs the adjustments needed to set up EFTEMs for effective usage so that the EFTEMs are adjusted to correct for electron optical aberrations of the energy filtering system 120 which would otherwise be present. The invention will be described relative to a series of procedures, shown in FIG. 3, each of which performs a beneficial adjustment for set up of the EFTEM with the procedures tending to be progressive in that, as the series progresses, the procedures achieve higher levels of refinement of the adjustment of the electron optics of the energy filtering system 120. In the field of energy filtered transmission electron microscopy, each level of refinement corrects aberrations of the Nth order, where N ranges from 0 to an upper limit constrained primarily by practical limitations of electron optical technology.

The procedures described herein correct aberrations up to and including the 2nd order; however, these procedures can be expanded as the technology advances as will be apparent to those skilled in the art. It is to be understood that while the entire series of adjustment procedures are normally performed in order to obtain a fine adjustment of an EFTEM, each can be individually utilized and form separate aspects of the present invention. Further, quadrupole and sextupole lenses will be described with regard to the invention without specific reference as to where these lenses are positioned within the energy filtering system 120 since a large variety of positions are possible for these lenses as will be apparent to those skilled in the art.

Aberrations of the lowest or 0th order involve lateral misalignments or displacements of the electron beam from a desired trajectory generally along an optical axis of the instrument. For the energy filtering system 120, the most critical alignment is that of the energy-dispersed beam through the slit opening 128S of the energy-selecting slit assembly 128. Thus, with regard to the embodiment of the apparatus shown in FIG. 1 and described above, correction of 0th order aberrations requires precise adjustment of the control current passing through the dispersing element 124 so that a known reference point, such as the zero loss peak, within the energy-dispersed beam or energy loss spectrum formed at the plane of the slit assembly 128 passes through the center of the slit opening 128S, see 150 FIGS. 3 and 4.

The automated adjustment for set up of the EFTEM to correct for 0th order aberrations is performed by first determining the approximate location of the energy-dispersed beam. First the entrance aperture assembly 118 and the slit assembly 128 are operated by the computer 126 to retract both from the beam path. The output image 138 captured by the beam detector assembly 130 or electron camera is read by the computer 126 and the intensities of all pixels of the output image 138 are summed to obtain a single numeric value proportional to the total electron beam intensity in the image 138, see block 152. Next, the slit assembly 128 is inserted into the beam path and the beam intensity of the resulting output image 138 is measured as before, see block 154. The total electron beam intensity with the slit inserted into the beam path is divided by the total electron beam intensity with the slit removed from the beam path to determine a ratio which represents the percentage of the energy-dispersed beam which passes through the slit opening 128S, see block 156. The ratio is compared to a selected percentage, for example ranging from about 10% to about 50% with 25% being selected for a working embodiment, see block 158.

If the ratio is at least 25% or at least the selected percentage, the zero loss peak of the energy loss spectrum is deemed to be coarsely aligned in the approximate vicinity of the slit opening 128S and the adjustment process proceeds to the next one of the series of adjustment procedures. If the ratio does not meet the selected percentage criterion, coarse alignment is performed by reading the beam current signals generated at the slit assembly 128 by the upper-slit beam current detector 132 and the lower-slit beam current detector 134, see block 160. The two beam current signals are compared to one another to determine whether the majority of the spectrum intensity falls on the upper slit half or on the lower slit half, see block 162. If the two beam current signals are not substantially equal to one another, the control current passing through the dispersing element 124 is adjusted to move the zero loss peak away from the slit half with the higher beam current signal until the readings from the currents detectors 132, 134 are substantially balanced, see block 164, at which point adjustment of the zero loss peak of the energy loss spectrum is deemed to be coarsely aligned with the slit opening 128S.

Figure 5:
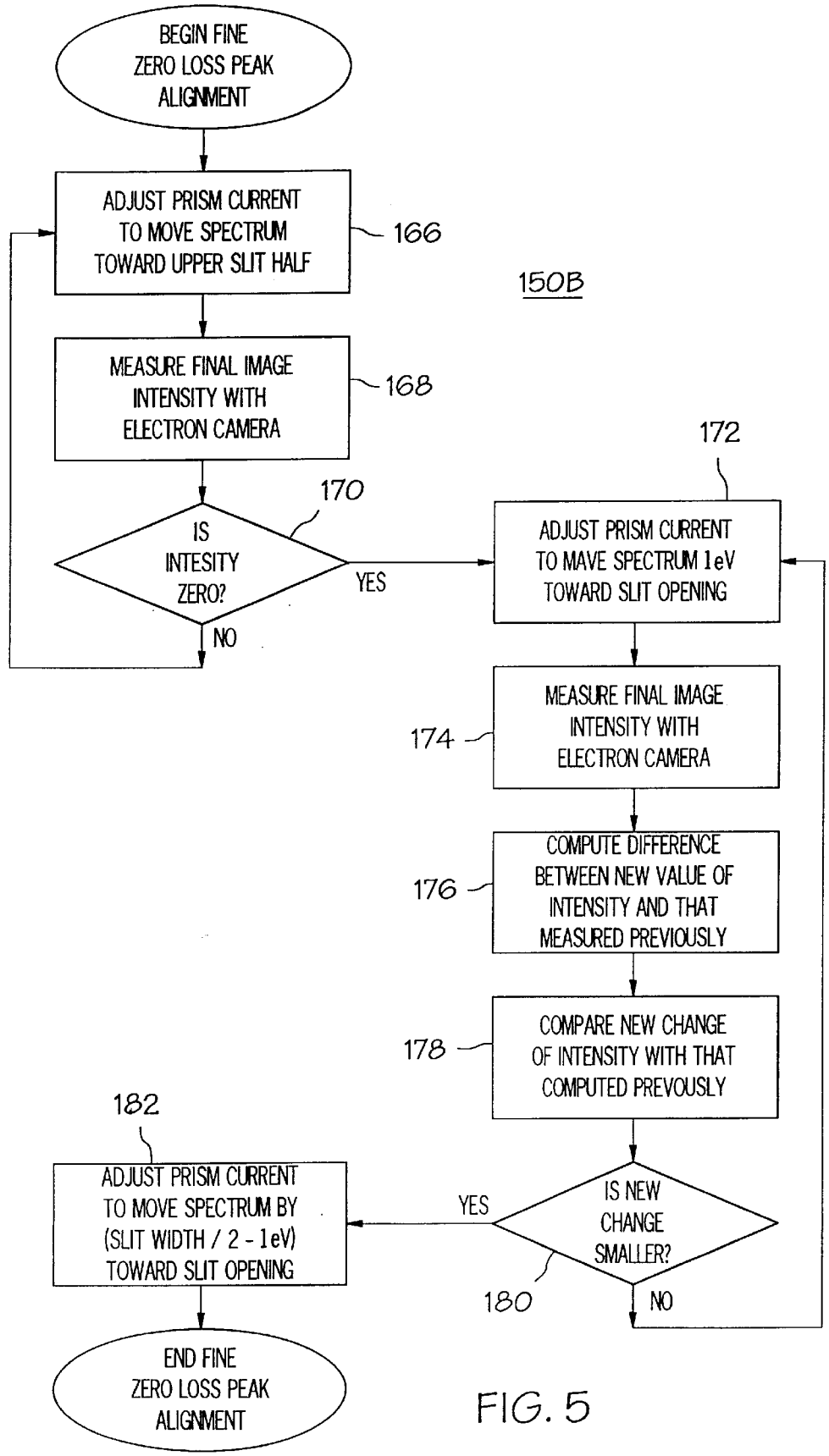
FIG. 5 is a flow chart of fine alignment of the zero loss peak of an energy loss spectrum with a slit opening in accordance with the present invention.

Once coarse alignment of the zero loss peak with the slit opening 128S has been achieved, fine centering of the zero loss peak within the slit opening 128S is performed by locating the zero loss peak relative to the upper knife edge 128U of the energy-selecting slit assembly 128. With reference to FIG. 5, the control current passing through the dispersing element 124 is adjusted to move the energy loss spectrum towards the upper slit half U until the beam intensity of the output image 138 captured by the beam detector assembly 130 is measured to be substantially zero, see blocks 166, 168, 170. The control current passing through the dispersing element 124 is then adjusted in the reverse direction to move the energy loss spectrum toward the slit opening 128S in discrete steps ranging, for example, from about 0.1 eV to about 5 eV with 1 eV being used for a working embodiment, see block 172.

The beam intensity in the output image 138 is measured at each step by the computer 126 via the beam detector assembly 130, see block 174. At each step, the difference between the just-measured intensity reading and the immediately preceding measured intensity is determined, see block 176. The energy loss spectrum is stepped until the current difference is smaller than the preceding one, i.e., until a peak intensity or maximum in the incremental intensity in the image 138 has been detected, see blocks 178, 180. When the maximum is detected, the zero loss peak is deemed to have just passed the upper knife edge 128U and to therefore be positioned at the knife edge to within a precision of one step, for example 1 eV.

The control current passing through the dispersing element 124 is then changed to move the zero loss peak toward the center of the slit opening 128S by an amount precisely equal to one half the slit width, see block 182. This precision control current change is possible because the computer 126 has calibrated information about the size of the slit opening 128S in eVs as well as calibrated information about the effect of control current changes to the dispersing element 124 in terms of energy loss spectrum displacements in eVs. While fine centering of the zero loss peak within the slit opening 128S could be performed directly as described without the coarse alignment, the initial coarse alignment greatly speeds up the entire alignment/centering procedure.

Figure 3:
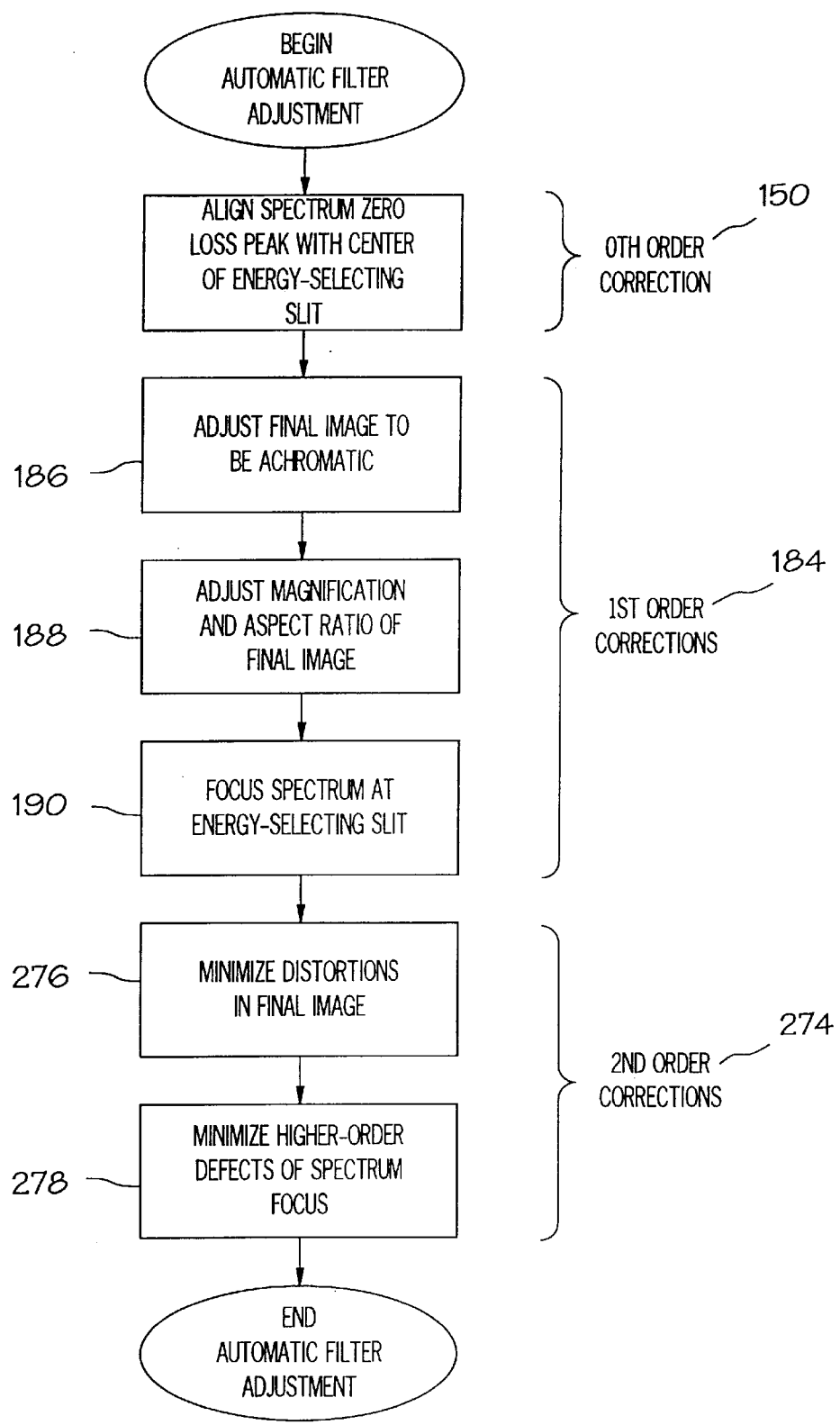
FIG. 3 is a high level flow chart for overall adjustment of an EFTEM in accordance with the present invention.
Figure 4:
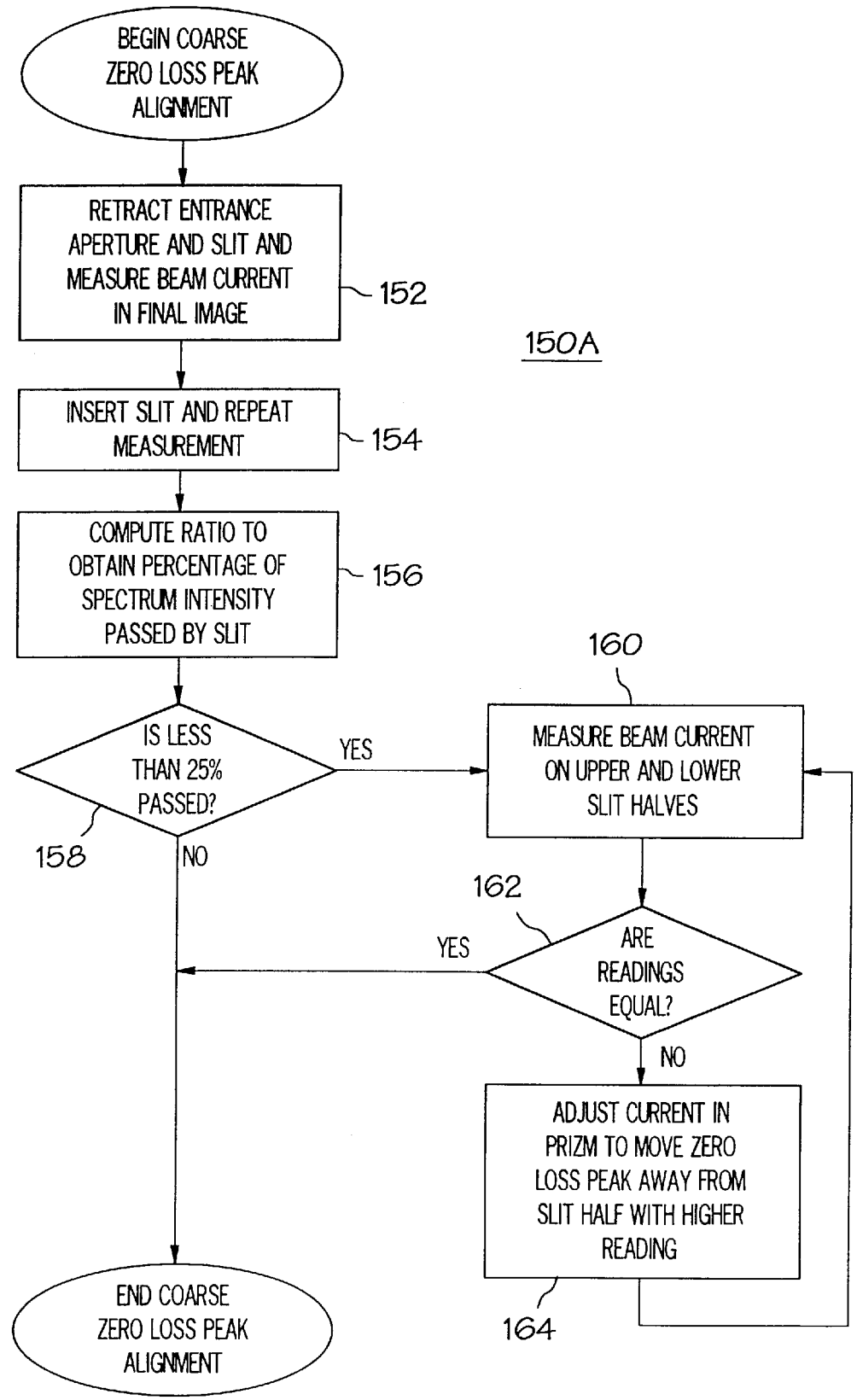
FIG. 4 is a flow chart of coarse alignment of the zero loss peak of an energy loss spectrum with a slit opening in accordance with the present invention.

Correction of the 1st order aberration defects of the electron optics of the energy filtering system 120 are next performed, see 184 in FIG. 3. The parameters of the electron optics of the energy filtering system 120 which are adjusted to correct the 1st order aberrations are: the degree to which components of the image formed with beam electrons of different energies are in perfect registration with each other, termed the achromaticity of the image, see block 186; the size, in both horizontal and vertical dimensions, of the image 138 formed at the beam detector assembly 130, termed the magnification and aspect ratio of the image 138, see block 188; and, the degree to which spatial information along the energy dimension of the energy loss spectrum formed at the slit assembly 128 has truly been demagnified to a vanishing spatial extent, termed the focus of the spectrum, see block 190.

The achromaticity of the image 138 is adjusted by varying a current, Ich, passing through a chromatic adjustment quadrupole lens that is part of the post-slit optics 136. The magnification and aspect ratio of the image 138 formed at the beam detector assembly 130 are adjusted by varying currents, Im1 and Im2, passing through two additional independent magnification adjusting quadrupole lenses that are also part of the post-slit optics 136. The focus of the energy loss spectrum formed at energy-selecting slit assembly 128 is adjusted by varying currents, Ifx and Ify, passing through two independent spectrum-focusing quadrupole lenses that are part of the pre-slit optics 122.

The achromaticity, magnification and aspect ratio of electron image 138 formed at the beam detector assembly 130 are assessed using an aperture or mask of known geometry and dimensions which is introduced into the beam path by means of the entrance aperture assembly 118. An image of the mask is then formed at the beam detector assembly 130 or electron camera. A large variety of masks can be used in the present invention with preferred forms of masks defining points and having spacing between those points such that the points and spacing can be easily determined from the mask image by the computer 126. Thus, while the preferred forms of masks are most easily included with the operating procedures performed by the computer 126, many other forms can be used but will require more effort in terms of programming the computer 126.

With this understanding, a currently preferred mask is formed as a pattern of apertures or a patterned aperture mask with the apertures being precisely formed and spaced on the mask which is introduced into the beam path via the entrance aperture assembly 118. Accordingly, an image of the mask is formed at the beam detector assembly 130 or electron camera. While a large variety of hole patterns are possible, a particularly advantageous pattern comprises a square array of precisely and finely laser-drilled holes. This embodiment of the mask comprises an n×n square array of such holes with n being odd and equal to or greater than 3, see for example, the mask 192 of FIG. 6 which forms a 5×5 square array. The particular physical dimensions of the mask are a function of the image magnification provided by the energy filtering system 120 and the size of the active area of the electron camera.

For a working embodiment of the apparatus, the magnification is approximately 20 and the active area of the electron camera is 25 mm×25 mm, thus the mask, whether patterned or of another geometry, must have an overall size of about 1 mm×1 mm. For the mask 192, the computer 126 captures the image of the mask 192 with the electron camera and determines the location of the center of each hole within the image. The displacement of the location of each hole position of the mask image from its anticipated position with perfectly adjusted optics, is measured, processed and converted by the computer 126 into correcting adjustments to currents Im1, Im2 and Ich passing through the aforementioned quadrupole lenses.

Figure 7:
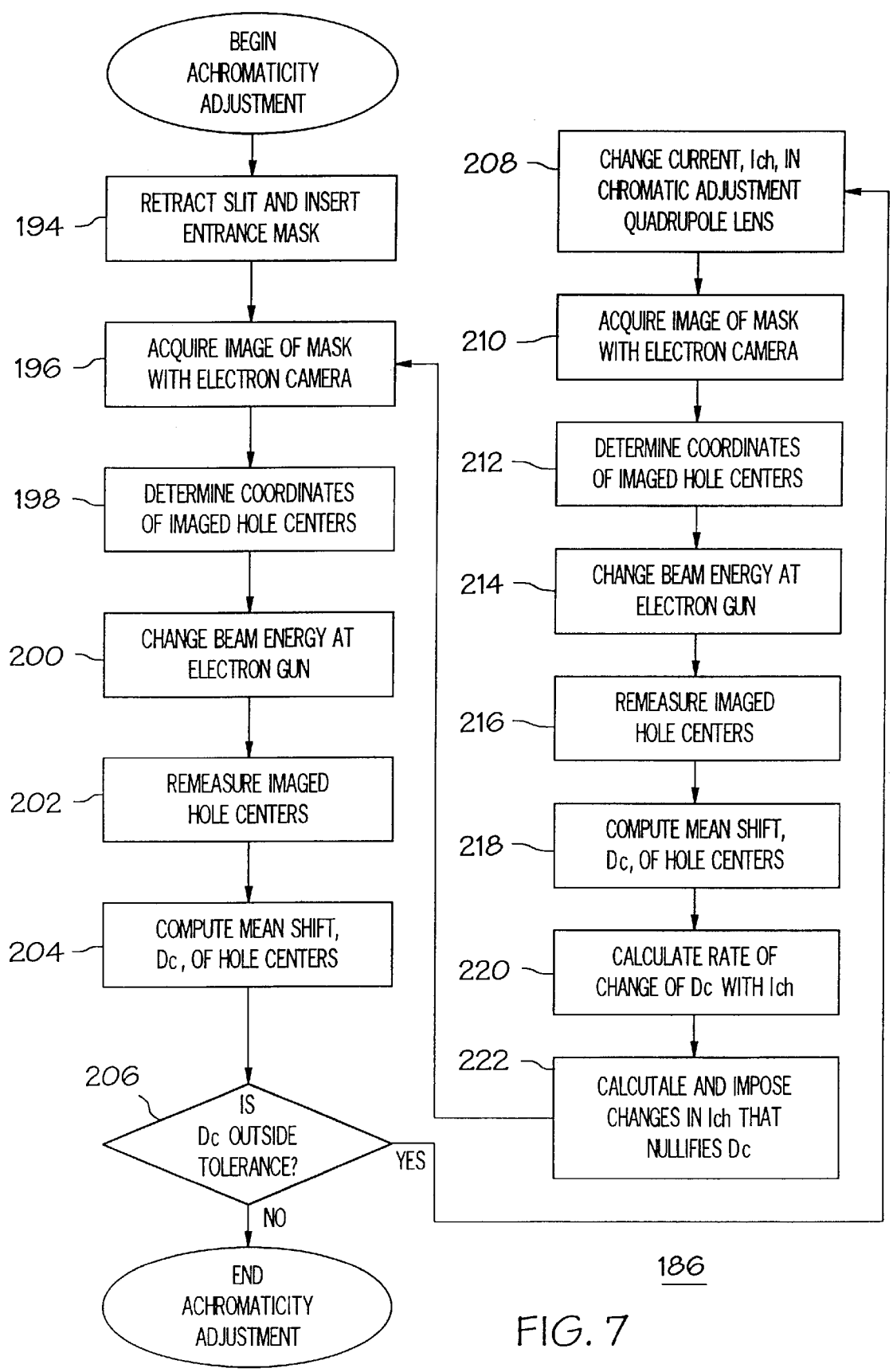
FIG. 7 is a flow chart of achromaticity adjustment in accordance with the present invention.

To achieve an achromatic final image, the computer 126 follows the procedure diagrammed in FIG. 7. The slit assembly 128 is retracted from the beam path and the mask 192 is inserted into the beam path via the entrance aperture assembly 118, see block 194. The imaged mask hole positions are then measured and stored by the computer 126 for later retrieval, see blocks 196, 198. A constant offset is applied to the energies of the beam electrons by changing the accelerating voltage at the electron gun 102 of the TEM 101, see block 200. If the imaging is not perfectly achromatic, the offset or change in beam energy results in an upward or downward shift of the image 138 of the mask 192 projected onto the beam detector assembly 130 or electron camera. Measurement of the imaged mask hole positions is repeated and, for each hole, the difference between its current position and that measured before the change in beam energy is determined, see blocks 202, 204. The resulting differences for all holes are averaged and the net average displacement, Dc, is taken as a measure of the system's departure from a true achromatic imaging condition.

If Dc is within an operator specified tolerance, the image 138 formed at the beam detector assembly 130 is deemed to be achromatic, see block 206. If not, the effect on Dc to changes in the current, Ich, passing through the chromatic adjustment quadrupole lens of the post-slit optics 136 is then assessed by the computer 126. The current, Ich, of the chromatic adjustment quadrupole lens of the post-slit optics 136 is changed, see block 208, and the measurement of net average displacement, Dc, is repeated for the same change in beam energy as was previously applied, see blocks 210–218. The effect of the chromatic adjustment quadrupole lens is then calculated, see block 220, using the following differential relationship:

$$dDc/dIch = (\text{change in Dc})/(\text{change in Ich}) \quad (1)$$

Using the value determined for dDc/dIch, the computer 126 estimates the change to Dc brought about by a change to Ich using the following linear equation:

$$dDc = (dDc/dIch)dIch \quad (2)$$

Since it is desirable to nullify Dc, the present value of Dc is substituted for dDc on the left side of equation (2), the equation is solved for dich and the current passing through the chromatic adjustment quadrupole lens is reduced by dich, see block 222. If greater focus precision is required, the procedure may be iterated starting with a new measurement of the imaged hole positions and calculation of Dc. Iteration is performed until Dc is substantially zero, i.e., within an operator specified tolerance. The image 138 formed at the beam detector assembly 130 is then deemed to be achromatic.

Figure 8:
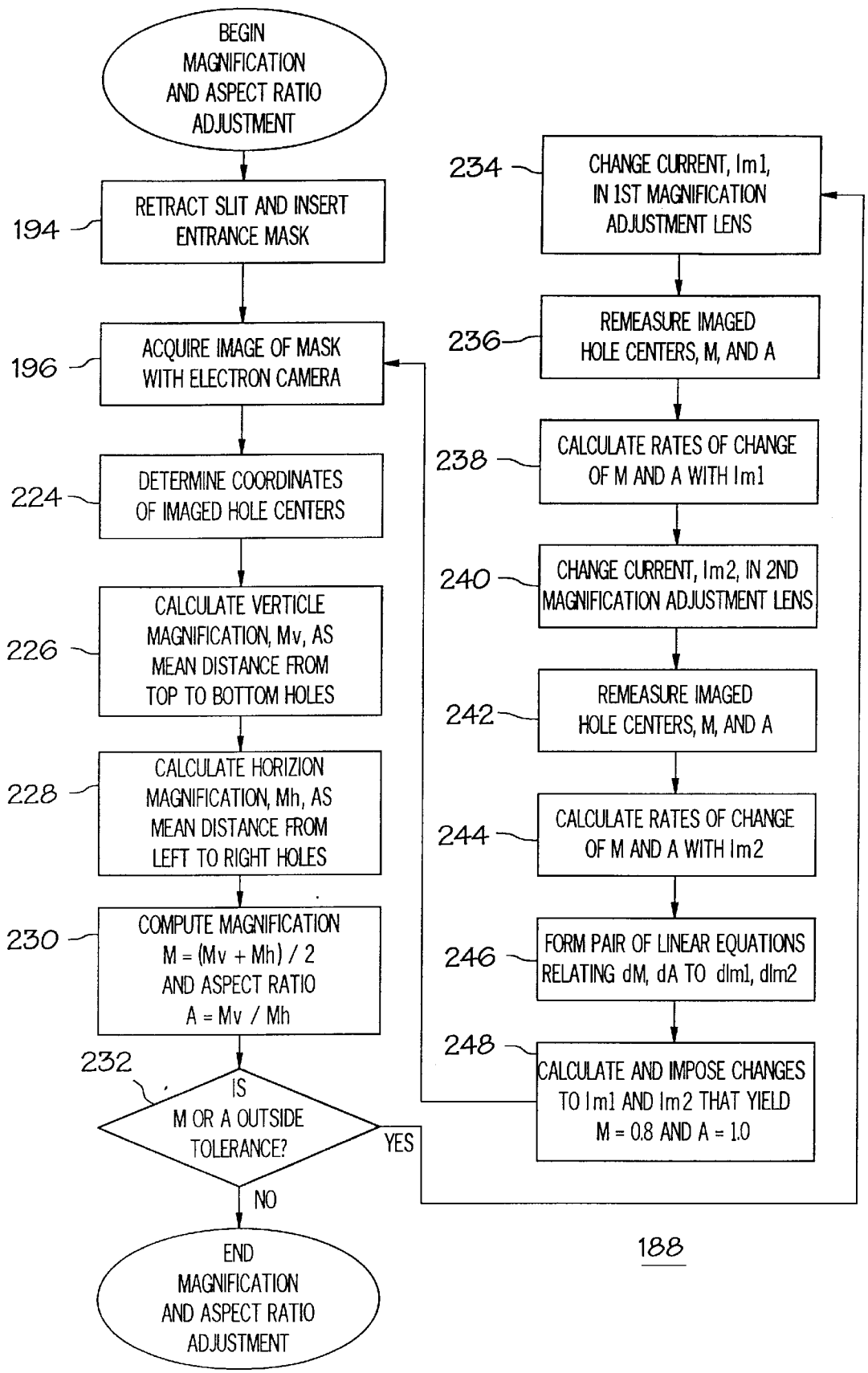
FIG. 8 is a flow chart of correction of magnification and aspect ratio of an image in accordance with the present invention.

To correct the magnification and aspect ratio of the image 138, the computer 126 follows the procedure diagrammed in FIG. 8. The imaged hole positions of the entrance mask 192 are once again measured, see block 224. The average distance between the top row of holes 192A and the bottom row of holes 192B is calculated as a fraction of the vertical dimension of the active area of the electron camera, see block 226. This fraction is taken as a measure of the magnification in the vertical dimension. The horizontal magnification is measured in an analogous fashion using the left-most and right-most columns of holes 192C, 192D, see block 228. The average of the vertical and horizontal magnifications is then calculated and stored for later retrieval by the computer 126 to obtain the overall magnification, M, of the image 138, as is the ratio of the vertical to the horizontal magnification which is utilized to obtain the aspect ratio, A, of the image 138, see block 230. If M or A is outside of operator specified tolerances, see block 232, the current, Im1, passing through the one of the aforementioned quadrupole lenses of the post-slit optics 136 is then changed and the measurement of magnification, M, and aspect ratio A is repeated, see blocks 234, 236. The incremental effect of Im1 on M and A is then computed, see block 238, according to the following differential relationships:

$$dM/dIm1 = (\text{change in M})/(\text{change in Im1}) \quad (3)$$

$$dA/dIm1 = (\text{change in A})/(\text{change in Im1}) \quad (4)$$

Im1 is then restored to its original value and the current Im2, passing through the other relevant quadrupole lens, is changed, see block 240. In a fully analogous manner, the incremental effect of Im2 is then computed, see blocks 242–246, according to the following additional differential relationships:

$$dM/dIm2 = (\text{change in M})/(\text{change in Im2}) \quad (5)$$

$$dA/dIm2 = (\text{change in A})/(\text{change in Im2}) \quad (6)$$

Using the determined values for dM/dIm1, dM/dIm2, dA/dIm1, and dA/dIm2, changes to M and A brought about by given changes to Im1 and Im2 are estimated by the computer 126 via the following pair of linear equations:

$$dM = (dM/Im1)dIm1 + (dM/dIm2)dIm2 \quad (7)$$

$$dA = (dA/Im1)dIm1 + (dA/dIm2)dIm2 \quad (8)$$

The difference between the current value of M and its preferred value, for example a preferred value of 0.80 was used in a working embodiment, is substituted for dM on the left side of equation (7) and the difference between the current value of A and its preferred value of 1.0 is substituted for dA on the left side of equation (8) and the resulting pair of linear equations are solved for dIm1 and dIm2 by the computer 126. The current changes thus determined are applied to the corresponding quadrupole lenses, see block 248. The measurements of M and A are repeated and, if the measured values still deviate from their preferred values by more than operator specified tolerances, the entire procedure, starting with the controlled changes to Im1 and Im2, is iterated until the specified tolerances are met.

The focus of the energy loss spectrum at the slit assembly 128 is assessed through use of the upper knife edge 128U of the energy-selecting slit assembly 128. Focus assessment is based on the variation of the beam intensity across the image 138 at the electron camera as beam energy is varied by means of the accelerating voltage at the electron gun 102 to scan the zero-loss peak of the energy loss spectrum across the knife edge 128U. If the energy loss spectrum is perfectly focused to all orders, the image intensity across the entire detector area of the electron camera will abruptly go from zero intensity to full intensity as the zero loss peak is scanned across the knife edge 128U from a fully obscured to an unobscured position, or from full intensity to zero intensity as the zero loss peak is scanned across the knife edge 128U from an unobscured position to a fully obscured position.

A defect of 1st-order focus along the energy dimension of the spectrum will cause beam intensity to first appear at the top or bottom edge of the image 138 at the electron camera and then gradually across the entire detector area of the camera as the defocused zero-loss peak is directed fully past the knife edge 128U. A defect of focus orthogonal to the energy dimension of the spectrum gives rise to a gradual disclosure of beam intensity from the left or right edge of the image 138 at the electron camera. The rate and orientation of beam intensity disclosure at the image 138 are measured, processed and converted by the computer 126 into correcting adjustments to currents Ifx and Ify passing through the spectrum-focusing quadrupole lenses that are part of the pre-slit optics 122.

Figure 9:
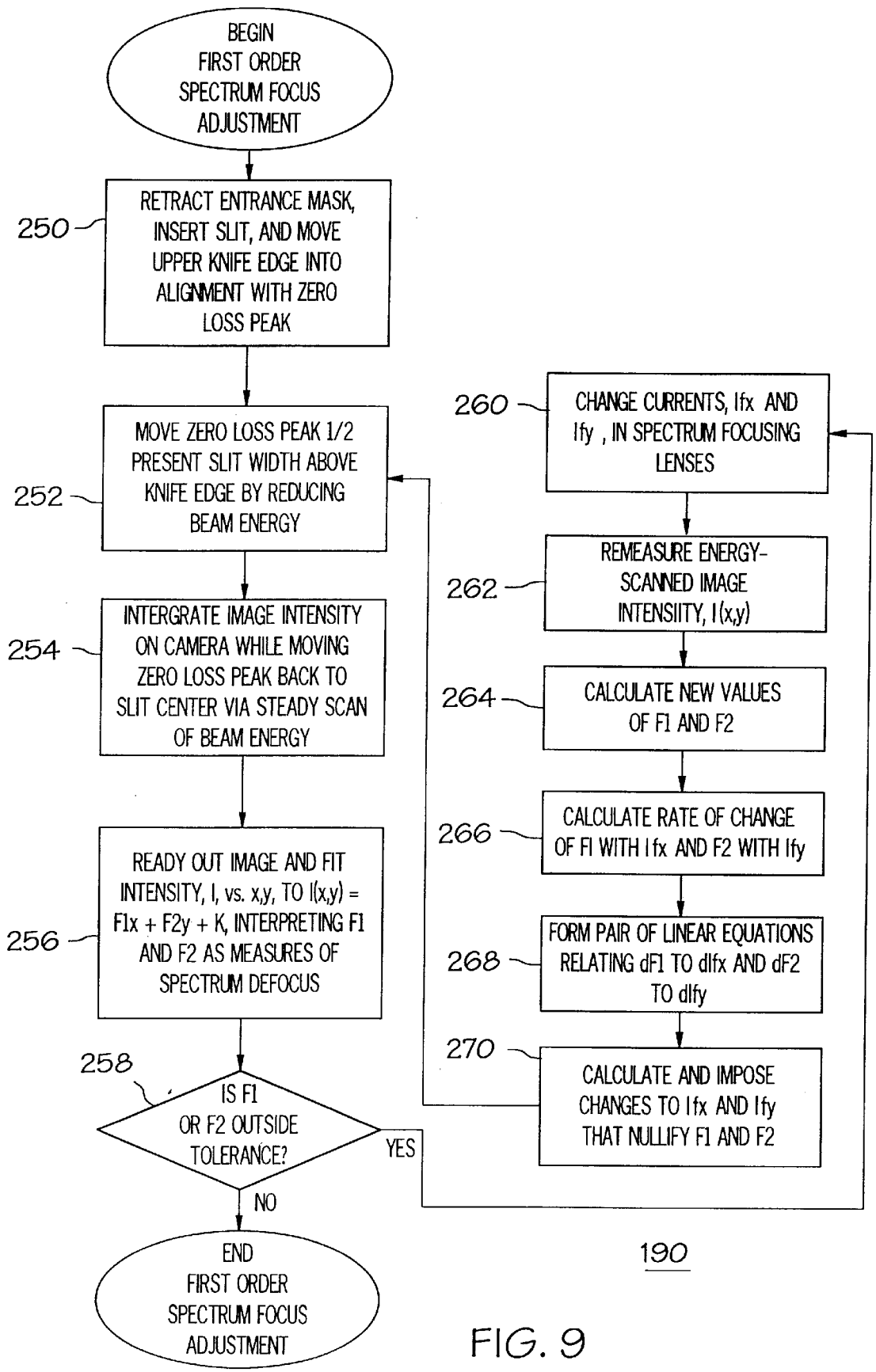
FIG. 9 is a flow chart of 1st order spectrum focus adjustment in accordance with the present invention.

To achieve a fully focused energy loss spectrum at the slit, the computer 126 follows the procedure diagrammed in FIG. 9. The entrance aperture assembly 118 is retracted from the electron beam path, the slit assembly 128 is inserted into the beam path by the computer 126, and the upper slit half U is moved downward by an amount SO/2 which is equal to one half the original slit opening 128S, see block 250. The beam energy is then changed by the computer 126 via the accelerating voltage at the electron gun 102 to move the zero loss peak of the spectrum up by an amount SO/4, i.e., one half the current slit opening above the upper knife edge 128U of the upper slit half U, see block 252. The electron camera is then controlled via the computer 126 to begin integrating beam intensity impinging at the image 138 while scanning the electron beam in energy across the upper knife edge 128U of the upper slit half U of the slit opening 128S, i.e., continuously and at a constant rate changing the beam energy to gradually shift the zero loss peak to a position SO/4 below the upper knife edge 128U, see block 254. The position SO/4 below the upper knife edge 128U is not critical but is used to ensure that the electron beam is not scanned onto the lower slit half L of the slit opening 128S.

Upon completion of the beam energy scan, the electron camera is controlled to halt integration of image intensity and to read out and transfer acquired image data to the computer 126. A surface plot of image intensity versus horizontal and vertical position within the image represents a surface that is tilted to the degree and direction that the spectrum is defocused, see block 256. In other words, if the spectrum is perfectly focused, the surface plot, termed the isochromatic surface, will be a perfectly flat and horizontal plane. A standard least squares fit of the following general two-dimensional linear equation to the measured isochromatic surface is then performed by the computer 126:

$$I = F1x + F2y + K \qquad (9)$$

where I is the image intensity at horizontal position x and vertical position y within the image 138. F1 and F2, 1st order aberration coefficients, give the slope of the isochromatic surface in the two orthogonal directions and serve as direct measures of the degree of spectrum defocus. If F1 or F2 is outside of specified tolerances, see block 258, the currents Ifx and Ify passing through spectrum-focusing quadrupole lenses that are part of the pre-slit optics 122 are changed by the computer 126 and the measurement of the coefficients F1 and F2 is repeated, see blocks 260–264. The effects of changes to Ifx and Ify are then calculated by the computer 126, see block 266, using the following differential relationships:

$$dF1/dIfx = (\text{change in F1})/(\text{change in Ifx}) \qquad (10)$$

$$dF2/dIfy = (\text{change in F2})/(\text{change in Ify}) \qquad (11)$$

Using the determined values for dF1/dIfx and dF2/dIfy, the changes to F1 and F2 brought about by given changes to Ifx and Ify are estimated by the computer 126, see block 268, using the following pair of linear equations:

$$dF1 = (dF1/dIfx)dIfx \qquad (12)$$

$$dF2 = (dF2/dIfy)dIfy \qquad (13)$$

Since it is desirable to nullify F1 and F2, the current value of F1 is substituted for dF1 on the left side of equation (12) and the current value of F2 is substituted for dF2 on the left side of equation (13). The computer 126 solves each of the resulting equations for difx and dify and applies the current changes to the spectrum-focusing quadrupole lenses, see block 270. The energy loss spectrum is then deemed to be focused to correct the 1st order aberration defects of the electron optics of the energy filtering system 120. If greater focus precision is required to attain operator specified tolerances, the procedure may be iterated starting with a new measurement of the isochromatic surface and calculation of new coefficients F1 and F2. Upon completion, the computer 126 restores the slit opening 128S to its original size and recenters the zero loss peak of the energy loss spectrum within the slit opening 128S.

Correction of the 2nd order aberration defects of the electron optics of the energy filtering system 120 are next performed, see 274 in FIG. 3. The two most noticeable 2nd order aberration defects of the electron optics of the energy filtering system 120 are exhibited as geometric distortions of the image 138 formed at the beam detector assembly 130 which can not be accounted for simply in terms of a non-unity aspect ratio, see block 276 in FIG. 3; and, additional defects of the focus of the energy loss spectrum at the energy-selecting slit assembly 128 resulting not from tilts of the isochromatic surface but rather from curvature of the isochromatic surface, see block 278 in FIG. 3.

Figure 10:
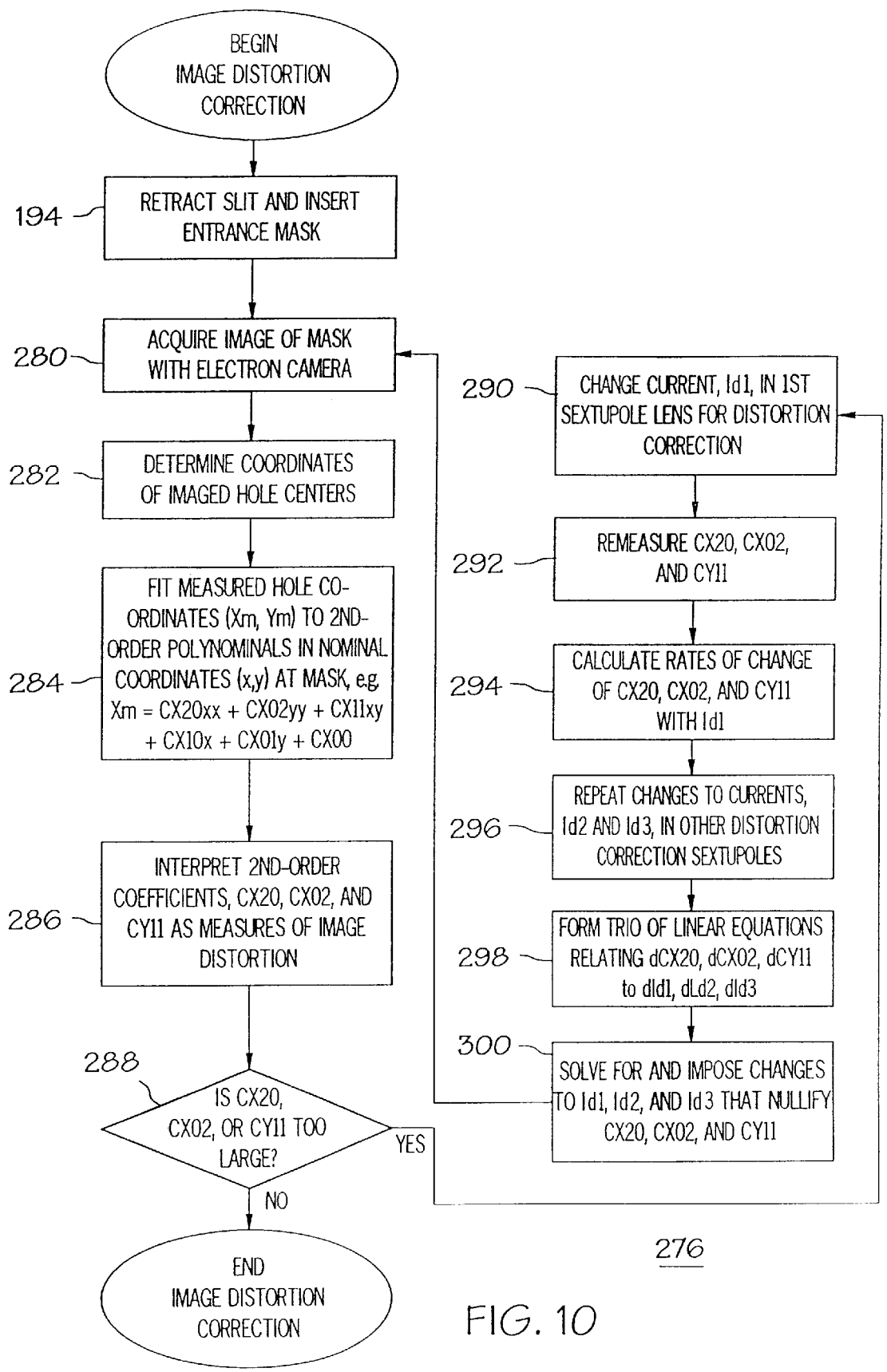
FIG. 10 is a flow chart of correction of 2nd order image distortion in accordance with the present invention.
Figure 11:
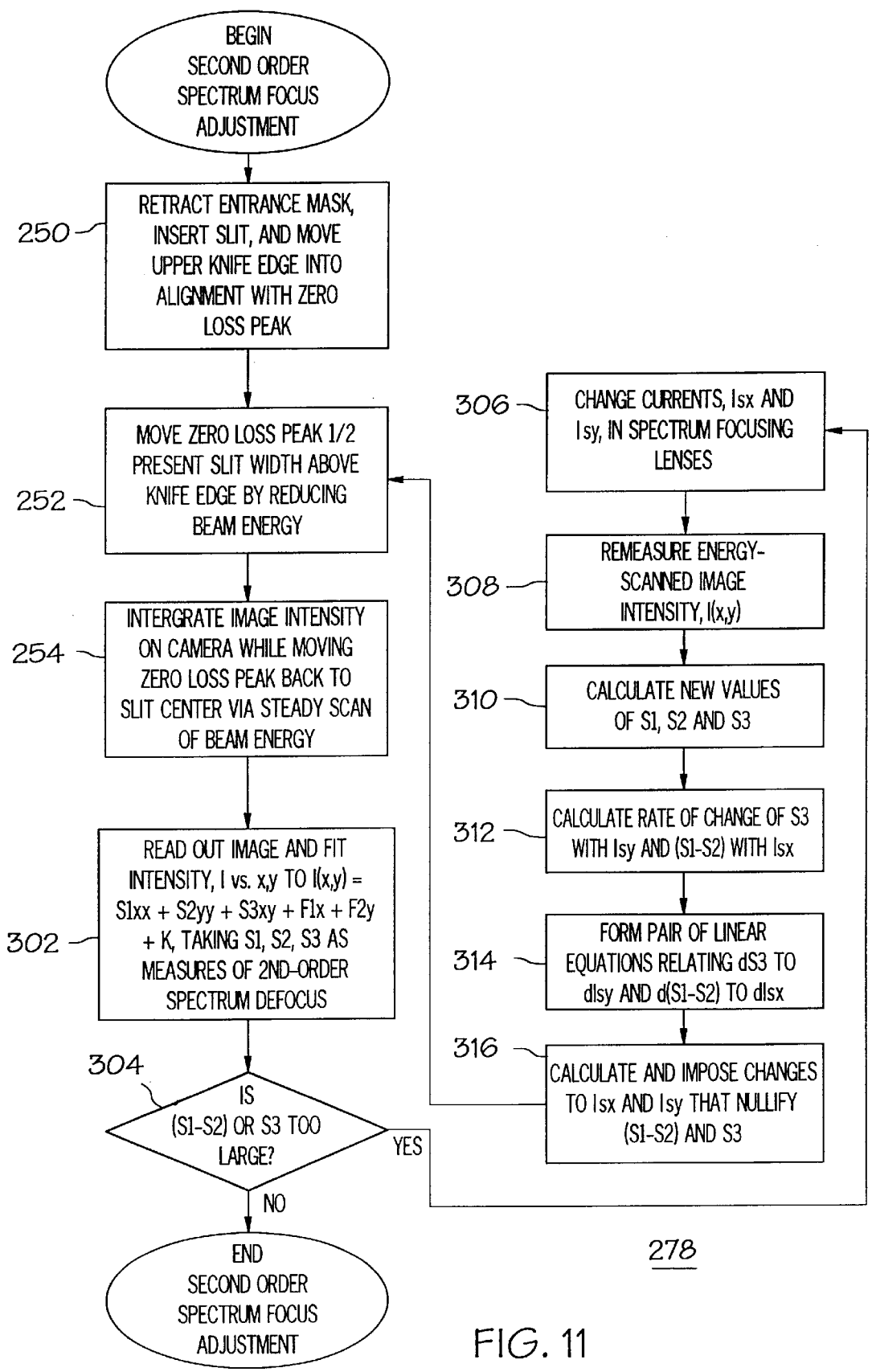
FIG. 11 is a flow chart of 2nd order spectrum focus adjustment in accordance with the present invention.

The 2nd order defects are corrected by the computer 126 following the procedures diagrammed in FIGS. 10 and 11 which are extensions of the methods used to measure the corresponding 1st order defects. The distortions in image 138 are corrected by varying currents, Id1, Id2, and Id3, passing through three distortion correcting sextupole lenses that are part of the post-slit optics 136. The 2nd order focus of the energy loss spectrum at the energy-selecting slit assembly 128 is adjusted by varying currents, Isx and Isy, passing through two orthogonal sextupole lenses that are part of the pre-slit optics 122.

For correction of 2nd order geometric image distortions, the computer 126 captures the image of the mask 192 with the electron camera and determines the location of the center of each hole within the image, see blocks 280, 282. For analysis of the hole position data to correct 2nd order aberrations, the following general equations for measured hole position (Xm, Ym) versus nominal hole position (x,y) are used as models in a pair of two dimensional least squares fits, one for horizontal measured coordinates, Xm, and the other for vertical measured coordinates, Ym.

$$Xm = CX20 x^2 + CX02 y^2 + CX11 xy + CX10 x + CX01 y + CX00 \qquad (14)$$

$$Ym = CY20 x^2 + CY02 y^2 + CY11 xy + CY10 x + CY01 y + CY00 \qquad (15)$$

where CX20, CX02, CX11, CY20, CY02, and CY11, are the 2nd order aberration coefficients that quantitatively describe the geometric distortions in the image 138, i.e., these coefficients are all substantially zero if all 2nd order distortions in the image 138 are perfectly corrected, see block 284.

Figure 6:
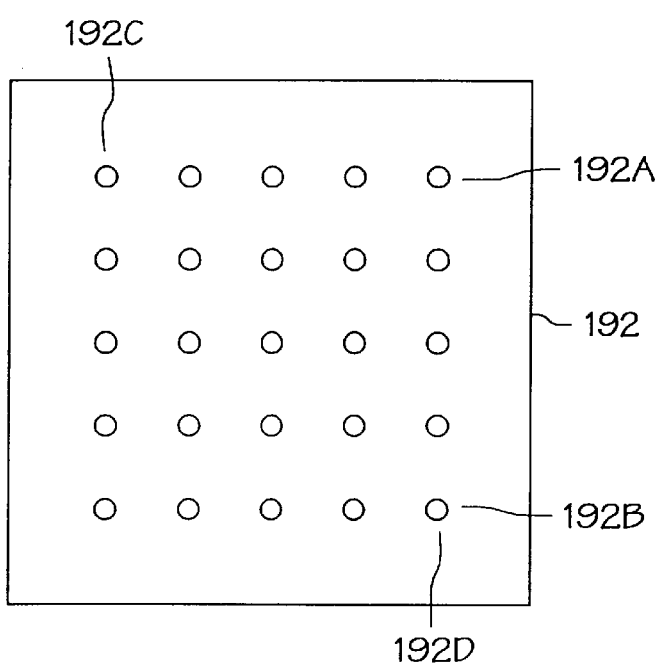
FIG. 6 shows a preferred patterned aperture mask which can be used in the present invention in accordance with the present invention.

For the 5×5 hole mask geometry of the mask 192 shown in FIG. 6, the nominal hole coordinates, x and y, each range over the following set of values: {−1.0, −0.5, 0.0, 0.5, 1.0}. With regard to the particular embodiment of the invention described herein, symmetries inherent to the EFTEM system 100 give the practical results that CX00=CY00=0 for a properly aligned mask, CX01=CY10=0, CX10=CY01=M (magnification), and only CX20, CX02, and CY11 have significant magnitude. The primary goal of this aspect of the present invention is therefore the nullification of the three aberration coefficients CX20, CX02, and CY11 through adjustments to the currents Id1, Id2, and Id3 passing through the aforementioned three sextupole lenses of the post-slit optics 136, see blocks 286, 288. In analogy with the 1st order procedure for adjusting the magnification and aspect ratio, the computer 126 first assesses, in turn, the effects of changes to each of the sextupole lens currents, Id1, Id2, and id3.

The computer 126 begins by changing Id1, collecting a new mask image, and calculating new values for CX20, CX02, and CY11, see blocks 290, 292. These new values are input to the following differential relationships:

$$dCX20/dId1 = (\text{change in CX20})/(\text{change in Id1}) \quad (16)$$

$$dCX02/dId1 = (\text{change in CX02})/(\text{change in Id1}) \quad (17)$$

$$dCY11/dId1 = (\text{change in CY11})/(\text{change in Id1}) \quad (18)$$

where dCX20/dId1, dCX02/dId1, and dCY11/dId1 each describe the effect of the first sextupole lens on one of the aberration coefficients, see block 294. The computer 126 then resets the current Id1 to its original value, changes the current Id2 passing through the second sextupole, and remeasures the aberration coefficients.

In a manner the same as that described relative to equations (16) through (18), the computer 126 then calculates values for dCX20/dId2, dCX02/dId2, and dCY11/dId2. Next, the computer 126 resets the value of Id2 to its original value, changes the current Id3, and calculates values for dCX20/dId3, dCX02/dId3, and dCY11/dId3, see blocks 296, 298. Using the determined values for the differential sextupole strength coefficients, the computer 126 estimates the net change to each of the aberration coefficients for given sextupole lens current changes via the following system of three linear equations:

$$dCX20 = (dCX20/dId1)dId1 + (dCX20/dId2)dId2 + (dCX20/dId3)dId3 \quad (19)$$

$$dCX02 = (dCX02/dId1)dId1 + (dCX02/dId2)dId2 + (dCX02/dId3)dId3 \quad (20)$$

$$dCY11 = (dCY11/dId1)dId1 + (dCY11/dId2)dId2 + (dCY11/dId3)dId3 \quad (21)$$

Since it is desirable to nullify each aberration coefficient, the computer 126 substitutes the current value of each of the coefficients, CX20, CX02, and CY11, on the left side of the corresponding equation of the equations (19), (20) and (21). The resulting system of three linear equations is solved for dId1, dId2, and dId3 and the resulting current changes are applied to the corresponding sextupole lenses, see block 300. The measurement of CX20, CX02, and CY11 is then repeated. If the coefficient magnitudes are still greater than operator specified tolerances, then the entire procedure, starting with the controlled changes to Id1 through Id3, is iterated until the specified tolerances are met.

The adjustment of spectrum focus to correct 2nd order aberrations begins with the isochromatic surface data collected for the corrections of 1st order aberrations in the energy loss spectrum focus. The curvature of the isochromatic surface is analyzed by generalizing the model polynomial function used in the two-dimensional least squares fit to the isochromatic surface as follows:

$$I = S1x^2 + S2y^2 + S3xy + F1x + F2y + K \quad (22)$$

where S1, S2, and S3 are the 2nd order aberration coefficients that quantitatively express the defect of 2nd order spectrum focus, i.e., if the spectrum is exactly in focus relative to 2nd order aberrations then each of S1, S2, and S3 has vanishing magnitude, see block 302. If (S1−S2) or S3 is too large, see block 304, the computer 126 then proceeds to change the currents, Isx and Isy, passing through the spectrum focusing sextupole lenses that are part of the pre-slit optics 122 and repeats the measurement of the aberration coefficients S1, S2, and S3, see blocks 306–310. The arrangement of the sextupole lenses is such that changes in Isx alter S1 and S2 by equal amounts but in opposite directions, while changes in Isy alter S3 exclusively. Optimal focus is thus achieved by nullifying the difference between the first two coefficients, S1, S2, and independently nullifying S3. The effects of changes in Isx and Isy are calculated by the computer 126 via the following differential relationships, see block 312:

$$d(S1-S2)/dIsx = (\text{change in } (S1-S2))/(\text{change in Isx}) \quad (23)$$

$$dS3/dIsy = (\text{change in S3})/(\text{change in Isy}) \quad (24)$$

Using the determined values for d(S1−S2)/dIsx and dS3/dIsy, the computer 126 estimates the changes to (S1−S2) and S3 brought about by given changes to Isx and Isy via the following pair of linear equations, see block 314:

$$d(S1-S2) = (d(S1-S2)/dIsx)dIsx \quad (25)$$

$$dS3 = (dS3/dIsy)dIsy \quad (26)$$

In analogy with the 1st order case, the computer 126 substitutes current values of (S1−S2) and S3 on the left sides of equations (25) and (26), respectively, and solves for the required sextupole lens current changes disx and disy. The currents Isx and Isy are reduced by the determined current changes and the energy loss spectrum is thereby deemed to be focused to the 2nd order, see block 316. If greater focus precision is required, the procedure may be iterated starting with a new measurement of the isochromatic surface and calculation of new (S1−S2) and S3.

For all orders of correction in the preceding description, it should be noted that the automatic adjustment of the electron optical elements is made possible by a link between the computer 126 and the energy filtering system 120, which permits the computer 126 to adjust the filter's electron optical elements under software control. The preferred link between the computer 126 and the energy filtering system 120 is a digital one, as illustrated through the EFTEM controller 112, but it is also possible to control the required electron optical elements by producing controlling voltages using digital-to-analog (D/A) converters driven by the computer 126, and sending appropriate voltages to analog summing junctions of the electronics of the energy filtering system 120.

The currently preferred and illustrated embodiment of the invention of the present application utilizes a mask which forms a patterned aperture array, i.e., the mask 192, which is selectively inserted at the entrance to the energy filtering system 120. However, applicants have recognized that filter aberrations can be assessed without such a mask by applying beam scanning capabilities of the TEM optics that precede the energy filter.

In a first embodiment utilizing beam scanning, the electron microscope optics that precede the energy filtering system 120 can be used to finely focus the beam at the entrance to the filter, thus forming a well-defined ray of illumination. The beam thus formed is then scanned or deflected in a pattern that matches the geometry of the mask 192 or of any other appropriate aperture or array of apertures selected for use in the invention. By rapidly executing the scan within the time allotted to a single exposure of the beam detector assembly 130, the electron images of the scanned finely focused beam are spot pattern images that are fully equivalent to the entrance mask images described above. Using such spot pattern images, all the analyses and adjustments described above that previously relied on patterned mask images may be performed exactly as before.

In a second embodiment utilizing beam scanning, the beam at the entrance to the energy filtering system 120 is spread out but imprinted with a well-defined intensity distribution, such as normally occurs due to passage of the beam through the sample 110. Again, the beam is scanned or deflected at the entrance to the energy filtering system 120 such that the center of the beam intensity distribution is successively placed at discrete positions corresponding to those of the holes of mask 192 or of any other appropriate aperture or array of apertures selected for use in the invention and the scanned beam is imaged on the beam detector assembly 130, just as with the focused beam approach described immediately above. The resulting scanned spread beam images are cross-correlated with yet another electron beam image taken without scanning or deflecting the beam, i.e., an undeflected beam image. Each cross correlation yields an image containing a peak marking the effective displacement of each scan position due to the aberrations/distortions of the energy filter. These cross-correlation peak images are superimposed to yield spot pattern images equivalent to those obtained in the preceding focused beam approach and all the analyses and adjustments described above may be performed exactly as before.

It is noted that any modern transmission electron microscope (TEM) provides several lenses that can serve to finely focus the beam at the entrance to the energy filtering system 120. For example, the condenser lenses 104 and/or the objective lens 114 that focus the illumination on the specimen, or any projector lenses, such as the projector lenses 116 that precede the energy filtering system 120. Similarly, the electron microscope also provides several sets of deflector elements that may be used to perform the patterned beam scan. These include the coils of the illumination deflector system 106 used to scan the illumination incident on the specimen, the image shift coils 115 used to align the initial specimen image with the optic axis of the projector lens system, or any projection system alignment coils 117 that precede the energy filtering system 120.

While the above description contains many specificities, these should not be construed as limitations on the scope of the invention, but merely as examples of currently preferred embodiments of the invention. Other embodiments and modifications will be apparent to those skilled in the art in view of the description and these alternates are considered to be within the scope of the claims of the present invention. For example, the invention is generally applicable to energy filtering systems associated with any form of electron microscope, for example scanning transmission electron microscopes. Also, the invention is generally applicable to EFTEMs wherever the energy filtering system may be located within the microscope. Further, while the invention is described with reference to a post-column EFTEM, it is equally applicable to in-column EFTEMs. In addition, while currents were adjusted within the electron lenses of the EFTEM for the described embodiment, the invention is equally applicable to control of the electron lenses by forward or backward movement of the lenses along the optic axis of the microscope.

The invention of the present application has been described relative to pre-slit and post-slit electron optics which, as described, is the currently preferred form of the invention. However, the only stipulation as to the positioning of the electron optics is that the optic elements which are used to adjust the spectrum at the slit plane must be pre-slit elements. The remaining optic elements may be positioned virtually anywhere between the entrance to the energy filtering system 120, even before the entrance aperture assembly 118, and the final image. The essential requirement in each instance is that the electron optic elements be so disposed and have sufficient strength to affect and correct the aberrations.

While the method described for characterizing the final image magnification is performed via average magnifications exhibited by features of an entrance mask or scanned beam image, it can also be determined by using the same analysis which is used for second order distortions but ignoring or leaving out the second order terms in the equations given in the description.

Although the currently preferred control of the beam energy in order to characterize energy-depend aberrations is to vary the accelerating voltage at the TEM electron gun 102, other means are possible. For example, an offset voltage can be applied to an evacuated metal tube or drift tube of the energy filtering system 120 to effectively temporarily change the electron energies while they are in the electromagnetic field of the electron prism. Alternately, the electron prism current can be varied. With this understanding, it should be apparent that the 0th order adjustment, i.e., the zero loss peak alignment, can also be effected by adjusting the accelerating voltage of the TEM electron gun 102 or the filter system drift tube voltage.

As noted above, other variations that would be apparent to one skilled in the art would be the use of different geometric patterns for the entrance mask or beam scanning, including non-square arrays of holes or scan points, as long as the precise hole positions on the mask or scan locations are known; holes or scan points of non-circular shape, e.g., a square or hexagonal grid; or even irregular, non-periodic, but precisely characterized mask or scan geometries. In another example, the computer 126 used to receive and analyze images can be replaced by a distributed computing system in which a first part receives images from the beam detector assembly 130; a second part, such as an array processor or other dedicated image processing hardware, performs fast computation of the noted parameters; and, either the first or the second part, or yet another part, determines the needed adjustments and communicates them to the microscope electronics.

Having thus described the invention of the present application in detail and by reference to preferred embodiments and alternates thereof, it will be apparent that additional modifications and variations are possible without departing from the scope of the invention defined in the appended claims.

What is claimed is:

1. A method for automatically performing set up adjustments for an energy filtering transmission electron microscope to correct electron optical aberrations of an energy filtering system of said microscope, said method comprising the steps of:

scanning an electron beam in a known geometric pattern at an entrance to an energy filtering system of said microscope;

detecting electron images of said scanned beam with a beam detector;

transferring said electron images to a computer;

analyzing said electron images of said scanned beam to determine needed adjustments for said energy filtering system of said microscope; and applying said adjustments to said energy filtering system of said microscope via communication between said computer and said microscope to automatically adjust said microscope.

2. A method for automatically performing set up adjustments for an energy filtering transmission electron microscope as claimed in claim 1 wherein said electron beam is finely focused.

3. A method for automatically performing set up adjustments for an energy filtering transmission electron microscope as claimed in claim 2 wherein said step of analyzing said electron images of said scanned beam comprises the steps of:
    locating positions of points within said scanned beam electron images;
    determining the displacements of the positions of said points relative to anticipated positions for a perfectly adjusted energy filter; and
    utilizing said displacements to determine needed adjustments for said energy filtering system of said microscope.

4. A method for automatically performing set up adjustments for an energy filtering transmission electron microscope as claimed in claim 3 wherein said steps of analyzing said electron images of said scanned beam comprises the steps of:
    (a) making first measurements of positions of points within said scanned beam images;
    (b) storing the point positions of the first measurements;
    (c) changing an accelerating voltage of an electron gun of said microscope;
    (d) making second measurements of positions of points within said scanned beam images;
    (e) determining differences between the positions of the first measured positions and the second measured positions;
    (f) adjusting said energy filtering system to correct said differences; and
        repeating steps (a) through (f) until said differences are within specified tolerances.

5. A method for automatically performing set up adjustments for an energy filtering transmission electron microscope as claimed in claim 4 wherein said step of repeating steps (a) through (f) is performed until said differences are substantially zero.

6. A method for automatically performing set up adjustments for an energy filtering transmission electron microscope as claimed in claim 2 wherein said step of analyzing said electron images of said scanned beam comprises the steps of:
    determining a first average vertical magnification, a first average horizontal magnification and a first average aspect ratio of an electron image of said scanned beam;
    changing current level through a first magnification adjusting quadrupole lens of said energy filtering system;
    determining a second average vertical magnification, a second average horizontal magnification and a second average aspect ratio of an electron image of said scanned beam;
    computing an incremental effect of changing current level through said first magnification adjusting quadrupole lens on magnification and aspect ratio from said first and second average vertical magnification, said first and second average horizontal magnification and said first and second average aspect ratios;
    restoring said current level through said first magnification adjusting quadrupole lens of said energy filtering system;
    changing current level through a second magnification adjusting quadrupole lens of said energy filtering system;
    determining a third average vertical magnification, a third average horizontal magnification and a third average aspect ratio of an electron image of said scanned beam;
    computing an incremental effect of changing current level through said second magnification adjusting quadrupole lens on magnification and aspect ratio from said first and third average vertical magnification, said first and third average horizontal magnification and said first and third average aspect ratios;
    estimating changes to magnification and aspect ratio brought about by said current changes to said first and second magnification adjusting quadrupole lenses;
    calculating needed current changes to said first and second magnification adjusting quadrupole lenses based on preferred values of magnification and aspect ratio;
    applying said needed current changes to said first and second magnification adjusting quadrupole lenses;
    measuring magnification and aspect ratio of said energy filtering system of said microscope;
    comparing said measured magnification and aspect ratio to said preferred values of said magnification and aspect ratio; and
    repeating the foregoing steps if the difference between said measured and preferred values of said magnification and aspect ratio exceed specified tolerances.

7. A method for automatically performing set up adjustments for an energy filtering transmission electron microscope as claimed in claim 6 wherein the steps of determining first, second and third average vertical magnifications; first, second and third average horizontal magnifications; and, first, second and third average aspect ratios of an electron image of said scanned beam comprises the steps of:
    measuring positions of points within said scanned beam images which are located adjacent the top, bottom, right side and left side of said scanned beam images;
    determining the average distance between the top and bottom points of said scanned beam images;
    determining the average distance between the right side and left side points of said scanned beam images;
    calculating an average vertical magnification;
    calculating an average horizontal magnification; and
    taking the ratio of said average vertical magnification to said average horizontal magnification to determine an aspect ratio for said scanned beam images.

8. A method for automatically performing set up adjustments for an energy filtering transmission electron microscope as claimed in claim 2 wherein said steps of analyzing said electron images of said scanned beam and applying said adjustments to said energy filtering system comprises the steps of:
    (a) measuring positions of points within said scanned beam images which are located adjacent the top, bottom, right side and left side of said scanned beam images;
    (b) determining an average distance between the top and bottom points of said scanned beam images;
    (c) determining an average distance between the right side and left side points of said scanned beam images;

(d) calculating an average vertical magnification from said average distance between the top and bottom points of said scanned beam images;

(e) calculating an average horizontal magnification from said average distance between the right side and left side points of said scanned beam images;

(f) taking the ratio of the average vertical magnification to the average horizontal magnification to determine an aspect ratio for said scanned beam images;

(g) changing current level through a first magnification adjusting quadrupole lens of said energy filtering system of said microscope;

(h) repeating steps (a) through (f);

(i) computing the incremental effect of changing current level through said first magnification adjusting quadrupole lens on magnification and aspect ratio of said scanned beam images;

(j) restoring the current level through said first magnification adjusting quadrupole lens of said energy filtering system of said microscope;

(k) changing current level through a second magnification adjusting quadrupole lens of said energy filtering system of said microscope;

(l) repeating steps (a) through (f);

(m) computing the incremental effect of changing current level through said second magnification adjusting quadrupole lens on magnification and aspect ratio of said scanned beam images;

(n) estimating the changes to magnification and aspect ratio brought about by said current changes to said first and second magnification adjusting quadrupole lenses;

(o) calculating needed current changes to said first and second magnification adjusting quadrupole lenses based on preferred values of magnification and aspect ratio;

(p) applying said needed current changes to said first and second magnification adjusting quadrupole lenses;

(q) measuring magnification and aspect ratio of said energy filtering system of said microscope;

(r) comparing said measured magnification and aspect ratio of said energy filtering system of said microscope to preferred values of said magnification and aspect ratio; and (s) repeating steps (a) through (r) if the difference between said measured and preferred values of said magnification and aspect ratio exceed specified tolerances.

9. A method for automatically performing set up adjustments for an energy filtering transmission electron microscope as claimed in claim 2 wherein said steps of analyzing said electron images of said scanned beam and applying said adjustments to said energy filtering system comprises the steps of:

locating positions of points within said scanned beam images;

changing current level through a first sextupole lens of said energy filtering system of said microscope;

calculating differential sextuple strength coefficients for current changes through said first sextupole lens;

resetting current level through said first sextupole lens;

changing current level through a second sextupole lens of said energy filtering system of said microscope;

calculating differential strength coefficients for current changes through said second sextupole lens;

resetting current level through said second sextupole lens;

changing current level through a third sextupole lens of said energy filtering system of said microscope;

calculating differential strength coefficients for current changes through said third sextupole lens;

estimating changes to aberration coefficients for sextupole lens current changes;

calculating needed current changes for said sextupole lenses;

applying said calculated needed current changes to said sextupole lenses;

comparing aberration coefficients to specified tolerances; and repeating said foregoing steps if said aberration coefficients are not within said specified tolerances.

10. A method for automatically performing set up adjustments for an energy filtering transmission electron microscope as claimed in claim 1 wherein said electron beam is spread and said method further comprises the steps of:

detecting an image of said spread beam without scanning said spread beam to generate an undeflected beam image;

transferring said undeflected beam image to said computer; and, wherein said step of analyzing said electron images of said scanned beam comprises the steps of:

cross-correlating said scanned beam images with said undeflected beam image to generate peak marking images which locate positions of points within said scanned beam electron images;

determining the displacements of the positions of said points relative to anticipated positions for a perfectly adjusted energy filter; and utilizing said displacements to determine needed adjustments for said energy filtering system of said microscope.

11. A method for automatically performing set up adjustments for an energy filtering transmission electron microscope as claimed in claim 10 wherein said steps of analyzing said electron images of said scanned beam comprises the steps of:

(a) making first measurements of positions of points within said scanned beam images;

(b) storing the point positions of the first measurements;

(c) changing an accelerating voltage of an electron gun of said microscope;

(d) making second measurements of positions of points within said scanned beam images;

(e) determining differences between the positions of the first measured positions and the second measured positions;

(f) adjusting said energy filtering system to correct said differences; and repeating steps (a) through (f) until said differences are within specified tolerances.

12. A method for automatically performing set up adjustments for an energy filtering transmission electron microscope as claimed in claim 11 wherein said step of repeating steps (a) through (f) is performed until said differences are substantially zero.

13. A method for automatically performing set up adjustments for an energy filtering transmission electron microscope as claimed in claim 10 wherein said step of analyzing said electron images of said scanned beam comprises the steps of:

determining a first average vertical magnification, a first average horizontal magnification and a first average aspect ratio of an electron image of said scanned beam;

changing current level through a first magnification adjusting quadrupole lens of said energy filtering system;

determining a second average vertical magnification, a second average horizontal magnification and a second average aspect ratio of an electron image of said scanned beam;

computing an incremental effect of changing current level through said first magnification adjusting quadrupole lens on magnification and aspect ratio from said first and second average vertical magnification, said first and second average horizontal magnification and said first and second average aspect ratios;

restoring said current level through said first magnification adjusting quadrupole lens of said energy filtering system;

changing current level through a second magnification adjusting quadrupole lens of said energy filtering system;

determining a third average vertical magnification, a third average horizontal magnification and a third average aspect ratio of an electron image of said scanned beam;

computing an incremental effect of changing current level through said second magnification adjusting quadrupole lens on magnification and aspect ratio from said first and third average vertical magnification, said first and third average horizontal magnification and said first and third average aspect ratios;

estimating changes to magnification and aspect ratio brought about by said current changes to said first and second magnification adjusting quadrupole lenses;

calculating needed current changes to said first and second magnification adjusting quadrupole lenses based on preferred values of magnification and aspect ratio;

applying said needed current changes to said first and second magnification adjusting quadrupole lenses;

measuring magnification and aspect ratio of said energy filtering system of said microscope;

comparing said measured magnification and aspect ratio to said preferred values of said magnification and aspect ratio; and repeating the foregoing steps if the difference between said measured and preferred values of said magnification and aspect ratio exceed specified tolerances.

14. A method for automatically performing set up adjustments for an energy filtering transmission electron microscope as claimed in claim 13 wherein the steps of determining first, second and third average vertical magnifications; first, second and third average horizontal magnifications; and, first, second and third average aspect ratios of an electron image of said scanned beam comprises the steps of:

measuring positions of points within said scanned beam images which are located adjacent the top, bottom, right side and left side of said scanned beam images;

determining the average distance between the top and bottom points of said scanned beam images;

determining the average distance between the right side and left side points of said scanned beam images;

calculating an average vertical magnification;

calculating an average horizontal magnification; and taking the ratio of said average vertical magnification to said average horizontal magnification to determine an aspect ratio for said scanned beam images.

15. A method for automatically performing set up adjustments for an energy filtering transmission electron microscope as claimed in claim 10 wherein said steps of analyzing said electron images of said scanned beam and applying said adjustments to said energy filtering system comprises the steps of:

(a) measuring positions of points within said scanned beam images which are located adjacent the top, bottom, right side and left side of said scanned beam images;

(b) determining an average distance between the top and bottom points of said scanned beam images;

(c) determining an average distance between the right side and left side points of said scanned beam images;

(d) calculating an average vertical magnification from said average distance between the top and bottom points of said scanned beam images;

(e) calculating an average horizontal magnification from said average distance between the right side and left side points of said scanned beam images;

(f) taking the ratio of the average vertical magnification to the average horizontal magnification to determine an aspect ratio for said scanned beam images;

(g) changing current level through a first magnification adjusting quadrupole lens of said energy filtering system of said microscope;

(h) repeating steps (a) through (f);

(i) computing the incremental effect of changing current level through said first magnification adjusting quadrupole lens on magnification and aspect ratio of said scanned beam images;

(j) restoring the current level through said first magnification adjusting quadrupole lens of said energy filtering system of said microscope;

(k) changing current level through a second magnification adjusting quadrupole lens of said energy filtering system of said microscope;

(l) repeating steps (a) through (f);

(m) computing the incremental effect of changing current level through said second magnification adjusting quadrupole lens on magnification and aspect ratio of said scanned beam images;

(n) estimating the changes to magnification and aspect ratio brought about by said current changes to said first and second magnification adjusting quadrupole lenses;

(o) calculating needed current changes to said first and second magnification adjusting quadrupole lenses based on preferred values of magnification and aspect ratio;

(p) applying said needed current changes to said first and second magnification adjusting quadrupole lenses;

(q) measuring magnification and aspect ratio of said energy filtering system of said microscope;

(r) comparing said measured magnification and aspect ratio of said energy filtering system of said microscope to preferred values of said magnification and aspect ratio; and (s) repeating steps (a) through (r) if the difference between said measured and preferred values of said magnification and aspect ratio exceed specified tolerances.

16. A method for automatically performing set up adjustments for an energy filtering transmission electron microscope as claimed in claim 10 wherein said steps of analyzing said electron images of said scanned beam and applying said adjustments to said energy filtering system comprises the steps of:

locating positions of points within said scanned beam images;

changing current level through a first sextupole lens of said energy filtering system of said microscope;

calculating differential sextuple strength coefficients for current changes through said first sextupole lens;

resetting current level through said first sextupole lens;

changing current level through a second sextupole lens of said energy filtering system of said microscope;

calculating differential strength coefficients for current changes through said second sextupole lens;

resetting current level through said second sextupole lens;

changing current level through a third sextupole lens of said energy filtering system of said microscope;

calculating differential strength coefficients for current changes through said third sextupole lens;

estimating changes to aberration coefficients for sextupole lens current changes;

calculating needed current changes for said sextupole lenses;

applying said calculated needed current changes to said sextupole lenses;

comparing aberration coefficients to specified tolerances; and repeating said foregoing steps if said aberration coefficients are not within said specified tolerances.

17. An energy filtering transmission electron microscope system including a transmission electron microscope and an associated energy filter, said system comprising:

a beam detector assembly for detecting electron images produced by said energy filtering transmission electron microscope system;

electron optics; and a computer coupled to said energy filter and said transmission electron microscope for controlling said microscope, said beam detector assembly and said electron optics to automatically perform set up adjustments for said energy filtering transmission electron microscope system, said electron optics being controlled to finely focus and scan an electron beam in a known geometric pattern at an entrance to said energy filter.

18. An energy filtering transmission electron microscope system as claimed in claim 17 wherein said electron optics comprise lenses within said transmission electron microscope.

19. An energy filtering transmission electron microscope system as claimed in claim 17 wherein said electron optics comprise alignment coils within said transmission electron microscope.

20. An energy filtering transmission electron microscope system including a transmission electron microscope and an associated energy filter, said system comprising:

a beam detector assembly for detecting electron images produced by said energy filtering transmission electron microscope system;

electron optics; and a computer coupled to said energy filter and said transmission electron microscope for controlling said microscope, said beam detector assembly and said electron optics to automatically perform set up adjustments for said energy filtering transmission electron microscope system, said electron optics being controlled to spread and scan an electron beam in a known geometric pattern at an entrance to said energy filter.

21. An energy filtering transmission electron microscope system as claimed in claim 20 wherein said electron optics comprise lenses within said transmission electron microscope.

22. An energy filtering transmission electron microscope system as claimed in claim 20 wherein said electron optics comprise alignment coils within said transmission electron microscope.

* * * * *